United States Patent [19]

Neckers et al.

[11] Patent Number: 4,924,009
[45] Date of Patent: May 8, 1990

[54] XANTHENE DYE COMPLEXES

[75] Inventors: Douglas C. Neckers, Perrysburg; Shwn M. Y. Linden, Bowling Green, both of Ohio

[73] Assignee: Bowling Green State University, Bowling Green, Ohio

[21] Appl. No.: 57,544

[22] Filed: Jun. 3, 1987

[51] Int. Cl.$^5$ ............................................. C07D 311/82
[52] U.S. Cl. ..................................... 549/223; 430/138
[58] Field of Search .......................................... 549/223

[56] References Cited

U.S. PATENT DOCUMENTS

| | | | |
|---|---|---|---|
| 3,615,452 | 10/1971 | Cerwonka | 96/35.1 |
| 3,808,006 | 4/1974 | Smith | 430/346 |
| 4,386,154 | 5/1983 | Smith et al. | 430/338 |
| 4,772,530 | 9/1988 | Gottschalk et al. | 430/270 |

FOREIGN PATENT DOCUMENTS 2094841  5/1987  Japan ................................. 549/223

OTHER PUBLICATIONS

The Merck Index, Tenth Edition, 1983, p. 8138, "Rose Bengal".
Easton, "Dye Sensitized Photopolymerization," *Advances in Photo Chemistry*, vol. 13.
Macrae, "Xanthene-Dye Photo-Sensitized Decomposition of a Diazonium Salt," *J.C.S. Chem. Comm.*, 1974, pp. 898–899.

*Primary Examiner*—Glennon H. Hollrah
*Assistant Examiner*—Susan P. Treanor
*Attorney, Agent, or Firm*—Thompson, Hine and Flory

[57] ABSTRACT

Photooxidizable dye complexes of the formula (I):

$$X^{-n}[Y^+]_n \qquad (I)$$

where X is a xanthene dye and Y is gegen ion selected from sulfonium, phosphonium, iodonium, pyrylium, hydrazinium, and hydrazide ions; and n is 1 to 2; the complexes are useful as photoinitiators or in photobleachable imaging systems.

19 Claims, No Drawings

XANTHENE DYE COMPLEXES

GOVERNMENT RIGHTS

Portions of the work underlying this application were funded by the U.S. Government. The U.S. Government has certain rights in the inventions disclosed herein.

BACKGROUND OF THE INVENTION

The present invention relates to a novel class of photooxidizable compounds. These compounds are complexes of xanthene dyes such as Rose Bengal, Eosin, Erythrosin, Fluorescein and esters thereof and gegen ions such as sulfonium, iodonium, phosphonium, pyrylium, hydrazinium, and hydrazide ions. These compounds are useful as free radical initiators or as photobleachable dyes for use in photobleach imaging systems. They may also be useful as catalysts in thick layer photopolymerization processes which produce layers of photopolymer up to 75 microns or more thick. Thus "in depth" photographic processes may be possible with these compounds.

An excellent summary of dye-sensitized photopolymerizable compositions is provided by Eaton, "Dye Sensitized Photopolymerization," *Advances in Photochem.*, Vol. 13, pp. 427–87. These compositions include a photoreducible or photooxidizable dye and a reducing agent. Upon exposure, actinic radiation is absorbed by the dye and the dye is raised to its excited electronic state, the lifetime of which may be less than $10^{-9}$ and up to $10^{-3}$ second, depending upon whether it is a singlet or triplet state. During this time, absorbed energy in the form of an electron must be transferred from the reducing agent to the photoreducible dye molecule or from the photooxidizable dye molecule to the oxidizing agent to produce the free radical. Prior initiator systems tend to provide relatively low film speeds. One reason for this is that the rate of electron transfer is diffusion controlled. Another is that most prior systems involve photoreduction of the dye triplet which is substantially slower than other reactions which would proceed through the dye singlet. The excited dye must interact (collide) with another molecule in the composition which quenches the dye and generates a free radical. This limits the film speed which one can achieve.

SUMMARY OF THE INVENTION

A principal object of the present invention is to provide a novel class of photooxidizable dye complexes for which the rate of electron transfer is not limited to diffusion controlled rates. These dye complexes can generally be represented by the formula (I)

$$X^{-n}[Y^+]_n \qquad (I)$$

where $X^-$ is an anionic xanthene dye and $Y^+$ represents a gegen ion selected from the group consisting of sulfonium, phosphonium, iodonium, pyrylium, hydrazinium, and hydrazide cations; and n is 1 or 2. The xanthene dye can be Rose Bengal, Eosin, Erythrosin or Fluorescein or an ester thereof.

The dye complexes of the present invention are believed to be advantageous because the dye and its quenching agent (the gegen ion) are associated in the dye complex and electron transfer is not dependent upon a diffusion controlled interaction between the two.

Using the Rehm - Weller equation the gegen ion is preferably selected to enhance or favor electron transfer. The Rehm - Weller equation (Rehm, D. and Weller A., *Isr. J. Chem.* (1970), 8, 259–71) can be simplified as $$\Delta G = E_{ox} - E_{red} - Eh\upsilon \qquad (Eq. 1)$$

where $\Delta G$ is the change in Gibbs free energy, $E_{ox}$ is the oxidation potential of the dye, $E_{red}$ is the reduction potential of the cation, and $E_{h\upsilon}$ is the energy of light used to excite the dye. Preferred gegen ions will have a reduction potential which yields a more negative free energy change. The oxidation potential of the dye ground state usually must be greater than the reduction potential of the gegen ion. Of course, there are other factors which influence electron transfer such as solvent selection and the radial distance between the dye and the gegen ion which are represented in the basic equation but omitted here for simplification.

The compounds of the present invention find utility in two particular areas, namely, as photoinitiators and as photobleachable dyes useful in the imaging systems described in U.S. Pat. Nos. 3,567,453; 4,307,182; 4,343,891; 4,447,521; and 4,450,227. This does not mean that all of the compounds are useful in both areas. Some compounds are capable of generating free radicals upon photooxidation and are useful in photopolymerizable compounds but are not photobleached. Other compounds are photobleached and are useful in bleach-type imaging systems but do not generate free radicals. Still others are very reactive sources of free radicals in the absence of oxygen but unreactive in the presence of oxygen, they are thus anticipated to have application as an aerobic initiators.

DETAILED DESCRIPTION OF THE PREFERRED EMBODIMENT

While the teachings herein find application to xanthene dyes generally they are particularly applicable to Rose Bengal, Eosin, Erythrosin and Fluorescein. The latter dyes are dianions; n is 2 in formula (I). The teachings herein are also applicable to 2'-esters of these dyes, which are monoanions in which the C-2' carbon atom is substituted by a —COOR group, and for which n is 1 in formula (I).

Useful esters are esters in which R is an alkyl, group of 1 to 12 carbon atoms, an aryl group of 6 to 10 carbon atoms or an aralkyl group of 6 to 10 carbon atoms, a vinyl group of 2 to 6 carbon atoms, an allyl group of 2 to 6 carbon atoms or R is one of the following:

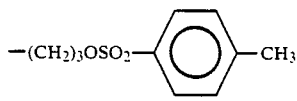

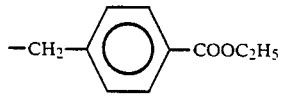

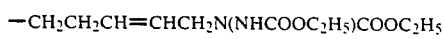

-continued

—(CH$_2$)$_{10}$CONHC$_6$H$_5$

—(CH$_2$)$_m$Br  Where m = 3–16.

Of the compounds of the present invention, those which have been studied in the most detail are those in which X is Rose Bengal or a 2'-ester of Rose Bengal where R is defined as above and is most typically benzyl.

Phosphonium ions useful in the present invention can be represented by the formula (II)

R'$_4$P$^+$                 (II)

where R' is an aryl group having 6 to 10 carbon atoms, an alkyl group having 1 to 6 carbon atoms or an arylalkyl group of 6 to 10 carbon atoms. Examples include triphenylaryl phosphonium ions where the aryl group is phenyl, benzyl (including benzyl substituted by p-CH$_2$Br, p-F, o-OH, p-OCH$_3$, —CH$_3$, p-NO$_2$ and p-Cl), diphenylmethyl, triphenylmethyl, a phenylalkylene group having 1 to 6 carbon atoms in the alkylene chain, α-methylnapthyl, β-methylnaphthyl, or 9-florenyl; tetralkyl phosphonium ions such as tetramethyl and tetrabutyl; triphenoxybromophosphonium ion; and triphenyl phosphonium ions of the formula (II-A)

(C$_6$H$_5$)$_3$R$^2$P$^{30}$         (II-A)

where R$^2$ is a cycloalkyl group such as cyclopropyl, cyclohexyl and cycloheptyl, cyclopropylcarbinyl, 1,4-dioxanyl, dithianyl, carboxyethylcyclopropyl, —CH(CH$_3$)COOC$_2$H$_5$, —(CH$_2$)$_o$COOC$_2$H$_5$ where o is 1 to 4, —(CH$_2$)$_p$COOH where p is 2 to 4, hydroxyl, —(CH$_2$)$_p$OH, —CH$_2$CHO, CH$_2$COCH$_3$, CH(CH$_3$)COC$_6$H$_5$, a straight chain alkyl group having up to 15 carbon atoms, a branched chain alkyl group having 3 to 5 carbon atoms, a halogen atom (e.g., bromine), CH$_2$=CH(CH$_2$)$_q$ where q is 0 to 4, an alkynyl group having 3 to 6 carbon atoms, (CH$_3$)$_2$C=C(H)CH$_2$—, CH$_3$OOCCH=CHCH$_2$—, (CH$_2$)$_r$P(C$_6$H$_5$)$_3$Cl where r is 2 to 6.

Iodonium ions useful in the present invention can be represented by the formula (III) or (IV):

ArAr'I$^+$               (III)

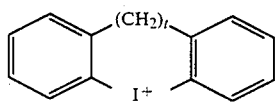   (IV)

where t is 1, 2 or 3 and Ar and Ar' can be the same or different and are selected from phenyl, 4-bromophenyl, 4-fluorophenyl, 4-chlorophenyl, 4-iodophenyl, 3-nitrophenyl, 4-nitrophenyl, 2-COOH phenyl, 2-nitrophenyl, 4-methylphenyl, 4-butylphenyl, 4-methoxyphenyl, 4-methylphenyl, 3-COOH phenyl and 4-cyclohexylphenyl.

Examples of hydrazinium ions useful herein are +NH$_3$NH$_2$, and +NH$_3$HNCONHNH$_2$. An example of hydrazide ion is an ammonium hydrzide such as +N(CH$_3$)$_3$CH$_2$CONHNH$_2$. These ions are used with the dianionic dyes in formula (I).

Sulfonium and pyrylium salts often react with xanthene dyes and esterify the 2'-position. Accordingly compounds according to these embodiments of the invention are usually esters although synthetic approaches are available to forming the dianionic species.

Sulfonium salts useful herein can be represented by the formula (V)

R$^3$$_3$S$^+$                (V)

where R$^3$ can be the same or different and is an alkyl group having 1 to 6 carbon atoms, an alkoxy group of 1 to 6 carbon atoms, a cycloalkyl group having 5 to 7 carbon atoms, an aryl group having 6 to 10 carbon atoms (e.g. phenyl), an alkynyl group of 2 to 3 carbon atoms, a —CH$_2$COOC$_2$H$_5$ group, or a —CH$_2$COC$_6$H$_5$ group. Representative examples are trimethylsulfonium, triethylsulfonium, triisopropylsulfonium, triphenylsulfonium, triethoxysulfonium, diphenylmethylsulfonium, diphenylcyclopropylsulfonium, (CH$_3$)$_2$CH$_2$COOC$_2$H$_5$S+, HC CCH$_2$(CH$_3$)$_2$S+, and C$^6$H$_5$COCH$_2$(CH$_3$)$_2$S+.

Pyrylium ions can be represented by the formula (VI), (VIA), or (VII):

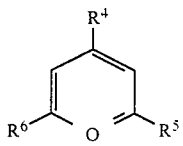   (VI)

where R$^4$, R$^5$ and R$^6$ may be the same or different and are selected from the group consisting of hydroxyl alkyl, aryl, and alkoxycarbonyl or the R$^6$ group may combine with the adjacent carbon atom to form a tetramethylene chain.

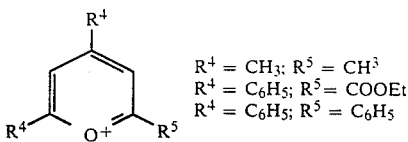   (VIA)

R$^4$ = CH$_3$; R$^5$ = CH$^3$
R$^4$ = C$_6$H$_5$; R$^5$ = COOEt
R$^4$ = C$_6$H$_5$; R$^5$ = C$_6$H$_5$

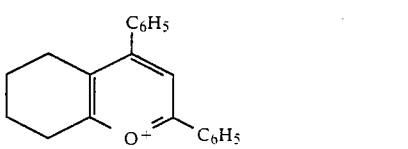   (VII)

Specific Preparations for Some of the compounds of the invention are provided below.

Rose Bengal (92%) and all other reagents were used as received. Infrared spectra were recorded on a Nicolet 20 DX FT infrared spectrometer and electronic absorption spectra were obtained from a Varian Cary 219 UV/VIS instrument. All the nmr spectra were taken using a Varian XL-200 nuclear magnetic resonance spectrometer. All new products had satisfactory elemental analyses.

The Rose Bengal esters were synthesized according to the procedure of J. J. M. Lamberts and D. C. Neckers, Zeit. f. Naturforsch 39b, 474 (1984). GLC analysis was performed on a Hewlett-Packard 5800 gas chromatograph equipped with a J & W fused Silica Capillary Column (15 m×0.252 mm) containing a methylsilicone film (0.25 mm thickness) and a flame ionization detector.

GENERAL PROCEDURE: IODONIUM SALTS

A mixture of Rose Bengal (2.00 mmol) and diphenyliodonium chloride (4.00 mmol) was stirred in $CH_2Cl_2$ (100 ml) for three hours in the dark. Any unreacted Rose Bengal was removed by filtration and the $CH_2Cl_2$ dried in vacuo. The resulting red-brown powder was stirred in ether (excess), filtered, and dried over night in a vacuum oven.

As an alternative, Rose Bengal lactone (see Lamberts and Neckers, supra) could also be used as the source of the dye. In this case the same relative quantities of iodonium salt and Rose Bengal lactone were required, but a few pellets of NaOH were added during the preparation to assist the ring opening of the lactone.

EXAMPLE 1

Synthesis of Rose Bengal Bis(Diphenyliodonium) Salt, I-b

A mixture of Rose Bengal I-a (2.57 g, 2.45 mmol) and diphenyliodonium chloride (1.61 g, 5.09 mmole) in 100 ml of $CH_2Cl_2$ was stirred in the dark at RT for three hours. A small amount of unreacted I-a (0.44 g) was filtered off and the $CH_2Cl_2$ filtrate was dried in vacuo. The resulting brown-red powder was stirred with 100 ml of anhydrous ether, filtered, and dried overnight in vacuum oven (45°) to give 3.49 g (89.5% yield) of brown, shining powder. I-b was also obtained in 65% yield from Rose Bengal lactone, III, and diphenyliodonium chloride in $CH_2Cl_2$ containing several pellets of NaOH. IR(KBr): 1599 cm$^{-1}$, nmr (CDCl$_3$: $\delta$7.80–7.29 (m).

EXAMPLE 2

Synthesis of Rose Bengal Benzyl Ester, Diphenyliodonium Salt, II-b

II-b was prepared in the same manner from Rose Bengal benzyl ester, monosodium salt II-a (0.33 g, 0.30 mmole) and diphenyliodonium chloride (0.10 g, 0.31 mmole) in $CH_2Cl_2$ (20 ml). Yield: 0.31 g, 77.4%. II-b was also obtained in 57.4% from Rose Bengal benzyl ester molecular form II-a' with diphenyliodonium chloride in $CH_2Cl_2$ containing several pellets of NaOH. ir(KBr): 1735 cm$^1$, nmr (CDCl$_3$): $\delta$8.00–7.00 (m, 17H), $\delta$4.97 (s, 2H) nmr (d6-acetone): $\delta$8.27–7.00 (m, 17H), $\delta$5.05 (s, 2H).

General Synthesis: Phosphonium Salts

Rose Bengal (1.00 mmol) and the phosphonium salt (2.00 mmol) were stirred in 50 ml $CH_2Cl_2$ in the dark. The product was obtained in a manner similar to the iodonum salt above.

EXAMPLE 3

Synthesis of Rose Bengal Bis(Benzyltriphenylphosphonium) Salt, I-c

I-c was prepared in the manner described above from I-a (1.13 g, 1.11 mmole) and benzyl triphenylphosphonium chloride (0.84 g, 2.16 mmole) in $CH_2Cl_2$ (50 ml). The yield was 1.670 g (99.5%). ir (KBr): 1629 cm$^{-1}$ nmr (CDCl$_3$):$\delta$7.68–7.00 (m, 42H), $\delta$4.80 (d, 4H).

EXAMPLE 4

Synthesis of Rose Bengal Benzyl Ester, Benzyltriphenylphosphonium Salt, II-c

II-c was prepared from the mixture of II-a (0.27 g, 0.25 mmole) and benzyltriphenylphosphonium chloride (0.11 g 0.28 mmole) in $CH_2Cl_2$ (50 ml). The yield was 0.29 g (81 1%). ir (KBr): 1735 cm$^{-1}$, nmr (CDCl$_3$: $\delta$7.80–7.00 (M, 22H), $\delta$5.10 (d,2H), $\delta$4.95 (s, 2H) nmr(d6-acetone): $\delta$7.90–7.00 (m, 22H), $\delta$5.60 (d, 2H), $\delta$5.04 (s, 2H).

EXAMPLE 5

Synthesis of Rose Bengal Benzyl Ester 2,4,6-Triphenylpyrylium Salt, II-d

II-d was prepared from the mixture of II-a (0.39 g, 0.36 mmole) and 2,4,6-triphenylpyrylium tetrafluoroborate (0.14 g, 0.35 mmole) in $CH_2Cl_2$ (20 ml). The yield was 0.37 g (76.05). ir(KBr): 1735 cm$^{-1}$, nmr (CDCl$_3$): $\delta$8.45–7.00 (m,24H), $\delta$4.98 (s, 2H).

In the case of the sulfonium salts, only the C-2' ester system was prepared. The general synthesis is given below:

GENERAL SYNTHESIS: ROSE BENGAL SULFONIUM SALT

Sulfonium salts are prepared from Rose Bengal, C-2' ester (0.20 mmol) and an appropriate sulfonium salt (0.23 mmol) by stirring in 20 ml. $CH_2Cl_2$ or in a mixture of petroleum ether/ether 1/1.

EXAMPLE 6

Synthesis of Rose Bengal Benzyl Ester, Diphenylmethylsulfonium Salt, II-3

II-e was prepared from the mixture of II-a (0.22 g 0.20 mmole) and diphenylmethylsulfonium tetrafluoroborate (0.06 g, 0.23 mmole) in $CH_2Cl_2$ (20 ml). The yield was 0.18 g (72.4%). The yield from another run was 90.0% when the mixed solvent of petroleum ether: ether (1:1) was used instead of ether (100%). ir(KBr): 1735 cm$^{-1}$, nmr (CDCl$_3$): $\delta$7.80–7.00 (m, 15H), $\delta$4.95 (s, 2H), $\delta$3.95 (s, 3H) nmr(d6-acetone): $\delta$8.16–7:00 (m, 15H), $\delta$5.05 (s, 2H), $\delta$4.03 (s, 3H)

EXAMPLE 7

Rose Bengal 4-Bromobutyl Ester Monosodium Salt

A solution Rose Bengal of (1.0 g, 0.98 mmol) and 1,4-dibromobutane (0.40 g, 1.85 mmol) in dry DMF (40 ml) was heated overnight at 85° C. while stirring. The excess DMF was removed in vacuo and the residue was washed with ether and $CH_2Cl_2$ to remove the excess 1,4-dibromobutane. The red precipitate was filtered and dried overnight in vacuo at 45° C.: IR (KBr) 1735 cm$^{-1}$; $^1$H- NMR (d$_6$-DMSO)$\delta$1.25 (m,4H); 3.58 (t,2H); 3.94 (t,2H); 7.44 (s,2H-xanthene); UV-VIS (CH$_3$OH) $\lambda$max=564, 524 nm.

EXAMPLE 8

Rose Bengal 3-Iodopropyl Ester Monosodium Salt

A solution of Rose Bengal 3-chloropropyl ester (monosodium salt) and a two flow molar exess of NaI was dissolved in acetone and refluxed for 24 hrs. The acetone was removed and the resulting precipitate was washed subsequently with water and $CH_2Cl_2$. The red precipitate was dried under vacuo at 45° C.: IR(KBr) 1735 cm$^{-1}$; $^1$H-NMR (d$_6$-DMSO) $\delta$1.78 (quin,2H); 2.94 (t,2H); 4.01 (t,2H); 7.43 (s,2H-xanthene); UV-VIS (CH$_3$OH) $\lambda$max=565,524 nm.

EXAMPLE 9

Rose Bengal 3-Tosylic Acid Propyl Ester Monosodium Salt

A solution of 1,3-propanediol (3.0 g, 39 mmol), p-toluenesulfonyl chloride (16.2 g, 85 mmol), and triethylamine (9.0 g, 89 mmol) in $CH_2Cl_2$-$CHCl_3$ (3:1) was stirred at room temperature. The solution turned light pink after 1 hour and a white percipitate formed ($Et_3N.HCl$). After 24 hours of stirring the precipitate was filtered off and the filtrate evaporated in vacuo. The white solid, 1,3-propaneditosylic acid ester, was then several times with $CH_3OH$ to remove residual $Et_3N.HCl$: m.p.=91°-92° C.; IR (KBr) 1173, 1373, 1609 $cm^{-1}$; $^1$H-NMR ($CDCl_3$) $\delta$1.97 (quin,2H); 2.43 (s,6H); 4.03 (t,4H); 7.32 (d,4H); 7.71 (d,4H).

A solution of Rose Bengal (1.0g, 0.98 mmol) and 1,3-propaneditosylic acid ester (0.80 g, 2.23 mmol) in dry DMF (40 ml) was heated at 60° C. for 4 hours. Under these reaction conditions the product obtained was exlusively monomer. The reaction temperature must be maintained at or below 60° c. in order to prevent competing dimer formation. IR (KBr) 1735 $cm^{-1}$; $^1$H-NMR ($d_6$-DMSO) $\delta$1.57 (quin,2H); 2.39 (s,3H); 3.83 (m,4H); 7.44 (s,2H-xanthene); 7.44 (d,2H); 7.71(d,2H). UV-VIS ($CH_3OH$)$\lambda$max=564, 524 nm.

EXAMPLE 10

Rose Bengal Ethyl Acetate Ester Monosodium Salt

A solution of Rose Bengal (1.00 g. 0.98 mmol) and ethyl bromoacetate (0.33 g, 1.98 mmol) in dry DMF (40 ml) was heated overnight at 85° C. while stirring. The excess ethyl bromoacetate and DMF was removed in vacuo and the residue was washed with petroleum ether followed by $CH_2Cl_2$. After filtration and thorough washing a red precipitate was isolated: IR(KBr) 1735 $cm^{-1}$; $^1$H-NMR ($d_6$-DMSO); 3.89 (q,2H); 4.54 (s,2H); 7.44 (s,2H-xanthene); UV-VIS ($CH_3OH$), $\lambda$max=564, 524 nm.

EXAMPLE 11

Rose Bengal Ethyl Butyrate Ester Monosodium Salt

By the procedure previously described, Rose Bengal disodium salt was converted to the ethyl butyrate ester using ethyl 4-bromo-butyrate: IF(KBr) 1735 $cm^{-1}$; $^1$H-NMR ($d_6$-DMSO) $\delta$1.48 (quin, 2H); 2.01 (t,2H); 3.94 (m,4H); 7.44 (s,2H); UV-VIS ($CH_3OH$) $\lambda$max=564, 524 nm.

EXAMPLE 12

Rose Bengal Ethyl 4-Methylbenzoate Ester Monosodium salt

A solution of α-bromo-p-toluic acid (10.0 g, 46.5 mmol), absolute ethanol (40 ml) and a catalytic amount of $H_2SO_4$ (3 percent on the weight of the acid) was heated to reflux for 8 hours. The majority of the ethanol was removed in vacuo and to the residue was added about 50 ml. ethyl ether and 50 ml. of water in a seperatory funnel. The upper layer was removed and washed subsequently with saturated sodium bicarbonate and water. The ethyl ether solution was dried with $MgSO_4$ and removed to yield a clear oil. This was used without further purification: IR (NaCl) 1737 $cm^{-1}$; $^1$H-NMR ($CDCl_3$) $\delta$1.27 (t.3H); 4.27 (q,2H); 4.52 (s,2H); 7.43 (d,2H); 7.94 (d,2H).

A solution of ethyl 4-bromomethyl benzoate (0.30 g, 1.23 mmol) and Rose Bengal (1.0 g, 0.98 mmol) in dry DMF was heated to 85° C. overnight. The workup was analogous to the previous Rose Bengal ester forming reactions: IR (KBr) 1735 $cm^{-1}$; $^1$H-NMR ($d_6$-DMSO) $\delta$1.33 (t,3H); 4.30 (q,2H); 5.06 (s,2H); 6.93 (d,2h); 7.42 (s,2H-xanthene); 7.76 (d,2H). UV-VIS ($CH_3OH$) $\lambda$max=565, 525 nm.

EXAMPLE 13

Rose Bengal Undecanoic Acid Ester Monosodiumsalt

A solution of Rose Bengal (1.0 g, 0.98 mmol) and 11-bromoundecanoic acid (0.30 g, 1.13 mmol) in dry DMF (50 ml) was heated overnight at 85° C. while stirring. The excess DMF was removed in vacuo and the residue was washed subsequently with ether and $CHCl_3$. The solid was filtered and dried overnight in a vacuum oven (45° C.); IR (KBr) 1735 $cm^{-1}$; $^1$H-NMR ($d_6$-DMSO)$\delta$0.74-1.63 (m,16H); 2.16 (t,2H); 3.89 (t,2H); 7.43 (s,2H).

EXAMPLE 14

Rose Bengal Dihydrazinium Salt

Rose Bengal lactone (0.24 g, 0.25 mmol) was suspended in $CH_2Cl_2$ (1 ml) and stirred. This light pink mixture was treated with hydrazine (0.03 g, 0.94 mmol) and an immediate color change from pink to dark red was observed. The mixture was stirred an additional 30 minutes at room temperature producing a dark red precipitate. The red precipitate was filtered and washed with $CDCl_3$ several times to remove residual lactone and then dried overnight in a vacuum oven (45° C.); IR (KBr) 1609 $cm^{-1}$; $^1$H-NMR ($d_6$-DMSO)$\delta$4.20 (bs,10H); 7.30 (s,2H); UV-VIS ($CH_3OH$) $\lambda$max=556, 518 nm.

EXAMPLE 15

Rose Bengal Dicabohydrazidium Salt

Rose Bengal lactone (0.20 g, 0.21 mmol) was suspended in ethanol and treated with carbohydrazide (0.037 g, 0.41 mmol) dissolved in ethanol-water (3:1). The solution was stirred for 24 hours at room temperature during which time a slow color change from pink to red was observed. After 24 hours the mixture was filtered and the clear red filtrate was removed in vacuo. The resulting red powder was washed with $CHCl_3$ and then dried overnight in a vacuum oven (45° C.); IR (KBr) 1609 $cm^{-1}$; $^1$H-NMR $d_6$-DMSO)-$\delta$5.16 (bs,14H); 7.34 (s,2H); UV-VIS ($CH_3OH$) $\lambda$max=557, 518 nm.

EXAMPLE 16

Rose Bengal Dibetaine Hydrazide Salt

Rose Bengal disodium salt (1.0 g, 0.98 mmol) was dissolved in a small amount of $CH_3OH$ (10 ml) and stirred. Girard's "T" (0.33 g, 1.98 mmol) dissolved in $CH_3OH$ (5 ml) was slowly added to this stirring solution and then stirred for an additional hour. After approximately 10 minutes, a white precipitate formed which was found to be sodium chloride. This white solid was filtered off and the filtrate was removed in vacuo to yield a solid residue. The red solid was washed with DME and dried overnight in a vacuum oven (45° C.): Solubility: $CH_3OH$ and EtOH. IR (KBr) 1616 $cm^{-1}$; 1686 $cm^{-1}$; $^1$H-NMR ($d_6$-DMSO)$\delta$3.18 (s,18H); 4.12 (s,4H); 4.45 (bs,4H); 7.32 (s,2H); 10.08 (bs,2H); IV-VIS ($CH_3OH$) $\lambda$max=518,556 nm.

EXAMPLE 17

Ester Form 1,5-Dibromopentane

Rose Bengal, disodium salt (4.0 mmol) and dibromopentane (2.0 mmol) in 30 ml–50 ml of DMF (dimethylformamide) was heated at 85° C. for a minimum of 24 hours. The DMF was then removed under vacuum and the precipitate washed with ether to remove the excess dibromopentane and then washed with water to destroy the residual Rose Bengal disodium salt. At this point two products remain; the monoester and the diester. The compounds are then separated by flash chromatography with a solvent ratio of 20:1 (methylene chloride:methanol). Another possible route is to extract the product in a soxlet extracter for several hours with methylene chloride. The monoester is washed away slowly. In the flash column, the first fraction is the monoester and the second fraction is the diester.

The compounds of the present invention can be mixed with a free radical addition polymerizable or crosslinkable compound to form a photopolymerizable composition.

Selected examples of anionic dye compounds are shown in Table 1 (λmax. ca. 570 nm in TMPTA). In Table 1 the symbol φ is used for a phenyl group and the Rose Bengal structure is abbreviated as below with the 3, 6 and 2' positions shown.

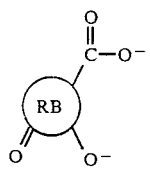

TABLE 1

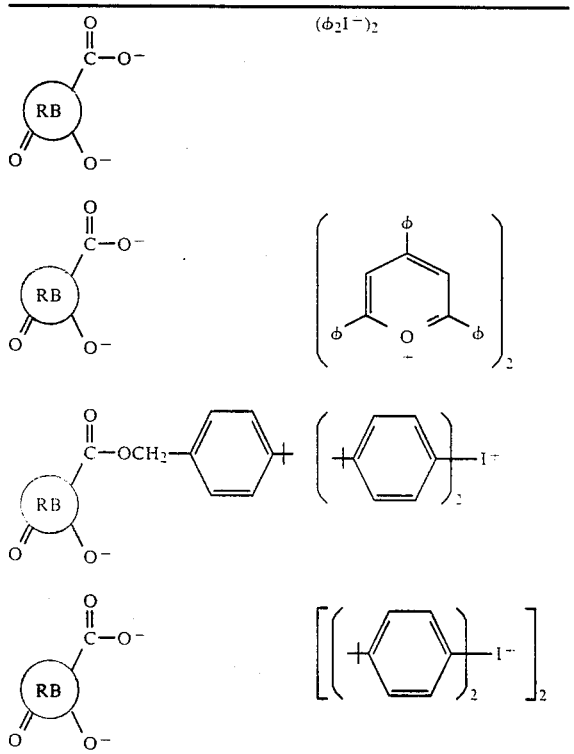

TABLE 1-continued

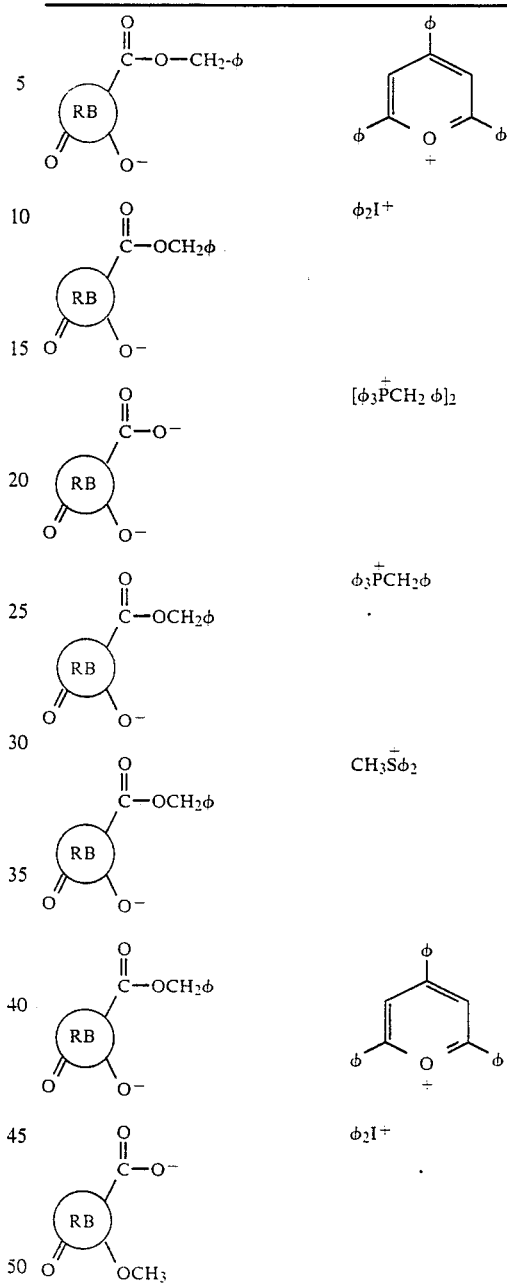

The most typical examples of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well-known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetra-methacrylate, dipentaerythritol hydroxypentacrylate (DPHPA), hexanediol-1,6-dimethacrylate, and diethylene glycol dimethacrylate.

The ionic dye compound is usually used in an amount up to about 1% by weight based on the weight of the photopolymerizable or crosslinkable species in the photohardenable composition. More typically, the compound is used in an amount of about 0.2% to 0.5% by weight.

While the compound can be used alone as the initiator, film speeds tend to be quite low and oxygen inhibition is observed. It has been found that it is preferable to use the compound in combination with an autoxidizer. An autoxidizer is a compound which is capable of consuming oxygen in a free radical chain process.

Examples of useful autoxidizers are N,N-dialkylanilines. Examples of preferred N,N-dialkylanilines are dialkylanilines substituted in one or more of the ortho-, meta-, or para- position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo.

Representative examples of N,N-dialkylanilines useful in the present invention are 4-cyano-N, N-dimethylaniline, 4-acetyl-N,N-dimethylaniline, 4-bromo-N, N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylthioanicidine, 4-amino- N,N-dimethylaniline, 3-hydroxy-N,N-dimethylaniline, N,N,N',N'-tetramethyl-1,4-dianiline, 4-acetamido-N,N-dimethylaniline, etc.

Preferred N,N-dialkylanilines are substituted with an alkyl group in the ortho-position and include 2,6-diisopropyl-N,N-dimethylaniline, 2,6-diethyl-N,N-dimethylaniline, N,N,2,4,6-pentamethylaniline (PMA) and p-t-butyl-N,N-dimethylaniline.

The autoxidizers are preferably used in the present invention in concentrations of about 4-5% by weight.

The photohardenable compositions of the present invention can be coated upon a support in a conventional manner and used as a photoresist or in photolithography to form a polymer image; or they can be encapsulated as described in U.S. Pat. Nos. 4,399,209 and 4,440,846 and used to control the release of an image-forming agent. The latter processes typically involve image-wise exposing the photosensitive material to actinic radiation and subjecting the layer of microcapsules to a uniform rupturing force such as pressure, abrasion, or ultrasonic energy whereupon the image-forming agent is released from the microcapsules for reaction with a developer.

Having described the invention in detail and by reference to preferred embodiments thereof, it will be apparent that modifications and variations are possible without departing from the scope of the invention defined in the appended claims.

What is claimed is:

1. An ionically bonded compound of the formula (I)

$$X^{-n}[Y^+]_n \quad (I)$$

wherein X represents an anionic xanthene dye and $Y^+$ represents a gegen ion selected from the group consisting of sulfonium, phosphonium, iodonium, pyrylium, hydrazinium and hydrazide ions and n is 1 or 2.

2. The compound of claim 1 wherein X is selected from the group consisting of Rose Bengal, Eosin, Erythrosin and Fluoroscein dyestuffs and esters thereof.

3. The compound of claim 2 wherein X is Rose Bengal or Rose Bengal benzyl ester.

4. The compound of claim 3 wherein Y is a phosphonium ion.

5. The compound of claim 4 wherein Y is selected from the group consisting of triphenylaryl phosphonium ions, triphenylalkyl phosphonium ions, tetraalkyl phosphonium ions and triphenoxybromophosphonium ion.

6. The compound of claim 3 wherein Y represents an iodonium ion.

7. The compound of claim 6 wherein said iodonium ion diphenyliodonium ion or an iodonium ion of the formula

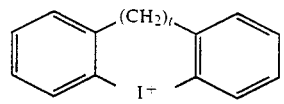

where t is 1, 2 or 3.

8. The compound of claim 3 wherein Y is a hydrazinium ion or a hydrazide ion.

9. The compound of claim 8 wherein said hydrazinium or hydrazide ion is selected from the group consisting of $NH_3NH_2^+$, $NH_3NHCONHNH_2^{30}$, and $N(CH_3)_3CH_2CONHNH_2^+$.

10. The compound of claim 3 wherein Y is a sulfonium ion.

11. The compound of claim 3 wherein Y is a sulfonium ion of the formula $$R_3S^+$$

where $R^3$ can be the same or different and is an alkyl group, a cycloalkyl group, an aryl group, an alkynyl group, a $-CH_2COOC_2H_5$ group or a $-CH_2COC_6H_5$ group.

12. The compound of claim 3 wherein Y is a pyrylium ion.

13. The compound of claim 12 wherein Y is a pyrylium ion of the formula

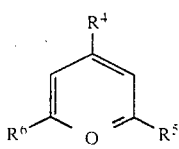

(VI)

where $R^4$, $R^5$ $R^6$ and may be the same or different and are selected from the group consisting of alkyl, aryl, and alkoxycarbonyl or the $R^6$ group may combine with the adjacent carbon atom to form a tetramethylene chain.

14. The compound of claim 3 wherein X is a Rose Bengal C-2' ester wherein the ester moiety is selected from the group consisting of

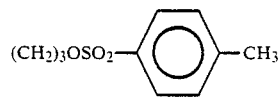

$(CH_2)_3COOC_2H_5$, $(CH_2)_{10}COOC_2H_5$, $CH_2COOC_2H_5$, $P-CH_2C_6H_5COOC_2H_5$.

15. The compound of claim 1 wherein said compound is capable of generating a free radical upon exposure to light.

16. The compound of claim 1 wherein said compound is photooxidizable.

17. The compound of claim 1 wherein said compound is photobleachable.

18. The compound of claim 1 wherein said compound is characterized in that following exposure of said compound to light, said dye is excited to a singlet state which is quenched by said gegen ion.

19. The compound of claim 15 wherein said compound is capable of initiating free radical polymerization upon exposure to light.

* * * * *